US012588463B2

(12) United States Patent
Han et al.

(10) Patent No.: US 12,588,463 B2
(45) Date of Patent: Mar. 24, 2026

(54) SEMICONDUCTOR DEVICE AND METHODS OF MAKING AND USING AN ENHANCED CARRIER TO REDUCE ELECTROSTATIC DISCHARGE

(71) Applicant: STATS ChipPAC Pte. Ltd., Singapore (SG)

(72) Inventors: MoonSu Han, Incheon (KR);
YoungJun Kim, Gyeonggi-do (KR);
DongChae Kim, Incheon (KR); Ilhan Jung, Seoul (KR); Cheolsoo Lee, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 441 days.

(21) Appl. No.: 18/304,641

(22) Filed: Apr. 21, 2023

(65) Prior Publication Data

US 2024/0355655 A1    Oct. 24, 2024

(51) Int. Cl.
H01L 21/673      (2006.01)
B32B 38/00      (2006.01)
(Continued)

(52) U.S. Cl.
CPC .... H01L 21/67306 (2013.01); B32B 38/0008 (2013.01); C09D 127/18 (2013.01);
(Continued)

(58) Field of Classification Search
CPC ........... H01L 23/522; H01L 2924/3025; H01L 21/67754; H01L 21/6773; H01L 21/67721;
(Continued)

(56) References Cited

U.S. PATENT DOCUMENTS 6,488,158 B1 * 12/2002 Khan ................ H01L 21/67333
                                      211/41.18
6,591,992 B1 * 7/2003 Dubey ............. H01L 21/67333
                                      211/41.18

(Continued)

FOREIGN PATENT DOCUMENTS

CN       111987026 A   * 11/2020  ............... G09F 3/02
CN       115472539 A   * 12/2022  ....... H01L 21/67336
(Continued)

OTHER PUBLICATIONS

PTFE Wafer Boat, 6 pages, https://www.sy-tech.com.tw/en/product/ptfe-wafer-boat.html, accessed Mar. 9, 2023.

*Primary Examiner* — David A Zarneke

(74) *Attorney, Agent, or Firm* — Brian M. Kaufman; Robert D. Atkins; PATENT LAW GROUP: Atkins and Associates, P.C.

(57) ABSTRACT

A semiconductor device is made with a boat carrier including stainless steel. A Polytetrafluoroethylene (PTFE) layer is formed over the boat carrier. A semiconductor package substrate is disposed over the boat carrier. A manufacturing step is performed on the semiconductor package substrate. An electrostatic discharge (ESD) is imparted on the boat carrier during the manufacturing step. The semiconductor package substrate is protected from the ESD by the PTFE layer.

25 Claims, 16 Drawing Sheets

(51) Int. Cl.
  *C09D 127/18* (2006.01)
  *H01L 21/687* (2006.01)
  *H01L 23/552* (2006.01)

(52) U.S. Cl.
  CPC .. *H01L 21/67316* (2013.01); *H01L 21/67323* (2013.01); *H01L 21/6733* (2013.01); *H01L 21/67336* (2013.01); *H01L 21/67343* (2013.01); *H01L 21/68757* (2013.01); *B32B 2255/06* (2013.01); *B32B 2255/26* (2013.01); *B32B 2255/28* (2013.01); *H01L 23/552* (2013.01)

(58) Field of Classification Search
  CPC ........... H01L 21/67336; H01L 21/6733; H01L 21/67236; H01L 21/67313; H01L 21/67316; H01L 21/67306; H01L 21/67323; H01L 21/67343; H01L 21/67366; H01L 23/552; B23B 38/0008; B23B 2225/06; B23B 2225/26; C09D 127/18

See application file for complete search history.

(56) References Cited

U.S. PATENT DOCUMENTS

| | | | |
|---|---|---|---|
| 6,976,585 B2 * | 12/2005 | Extrand | B08B 17/06 |
| | | | 211/41.18 |
| 10,950,485 B2 * | 3/2021 | Hung | H01L 21/67742 |
| 11,532,499 B2 * | 12/2022 | Hung | H05F 1/00 |
| 11,540,432 B2 * | 12/2022 | Natu | H01L 21/68757 |
| 11,854,860 B2 * | 12/2023 | Hung | H01J 37/32715 |
| 11,943,874 B2 * | 3/2024 | Nickkolgh | H01L 21/67336 |
| 12,308,267 B2 * | 5/2025 | Lamprecht | H01L 21/67383 |
| 2005/0051083 A1 * | 3/2005 | Ruiz | H01L 21/67316 |
| | | | 118/58 |
| 2017/0250103 A1 * | 8/2017 | Visser | C23C 16/26 |
| 2021/0195753 A1 * | 6/2021 | Nickkolgh | H01L 21/67336 |
| 2023/0009692 A1 * | 1/2023 | Lee | C23C 16/45536 |

FOREIGN PATENT DOCUMENTS

| | | | | |
|---|---|---|---|---|
| EP | 4593071 A1 | * | 7/2025 | ......... H01L 21/6838 |
| GB | 1054116 A | * | 1/2009 | ............. G21C 3/64 |
| KR | 100390452 B1 | * | 7/2003 | |
| KR | 101048288 B1 | * | 7/2011 | ........ H01L 21/6733 |
| KR | 20120087658 A | * | 8/2012 | ....... H01L 21/67316 |
| KR | 20-0471999 Y1 | | 3/2014 | |
| KR | 10-1935284 B1 | | 12/2018 | |
| KR | 10-2020-0117207 A | | 10/2020 | |
| KR | 20210141822 A | * | 11/2021 | ......... B25J 15/0014 |
| KR | 20230144940 A | * | 10/2023 | ....... H01L 21/67092 |
| KR | 20250127336 A | * | 8/2025 | ........... H01M 4/623 |

* cited by examiner

SEMICONDUCTOR DEVICE AND METHODS OF MAKING AND USING AN ENHANCED CARRIER TO REDUCE ELECTROSTATIC DISCHARGE

FIELD OF THE INVENTION

The present invention relates in general to semiconductor devices and, more particularly, to a semiconductor device and method of making and using an enhanced carrier to reduce electrostatic discharge.

BACKGROUND OF THE INVENTION

Semiconductor devices are commonly found in modern electrical products. Semiconductor devices perform a wide range of functions, such as signal processing, high-speed calculations, transmitting and receiving electromagnetic signals, controlling electrical devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices are often susceptible to damage caused by electrical shock from electrostatic discharge (ESD). ESD can occur at any stage of manufacturing semiconductor products and can easily introduce manufacturing defects. Many precautions are taken during the manufacturing process to mitigate damage from ESD, but still a certain percentage of units are damaged. Therefore, a need exists for additional techniques to mitigate ESD during the semiconductor manufacturing process.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements having a similar function are assigned the same reference number in the figures. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
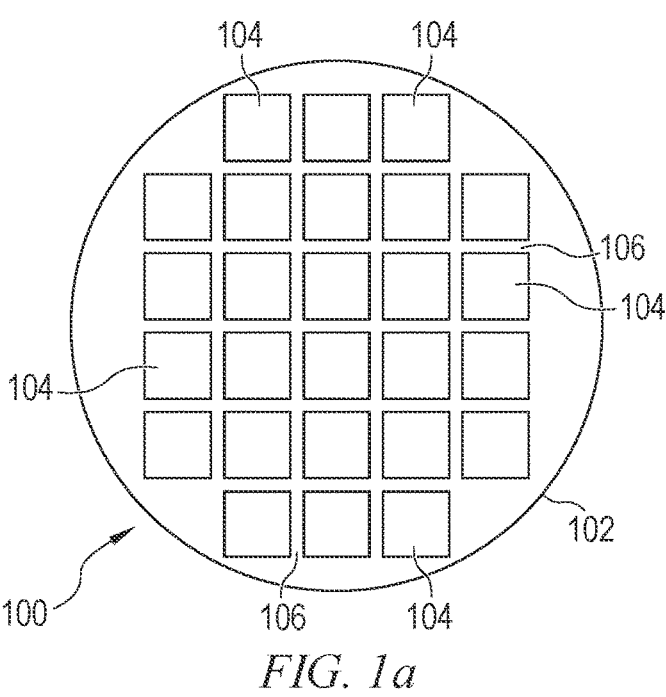
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
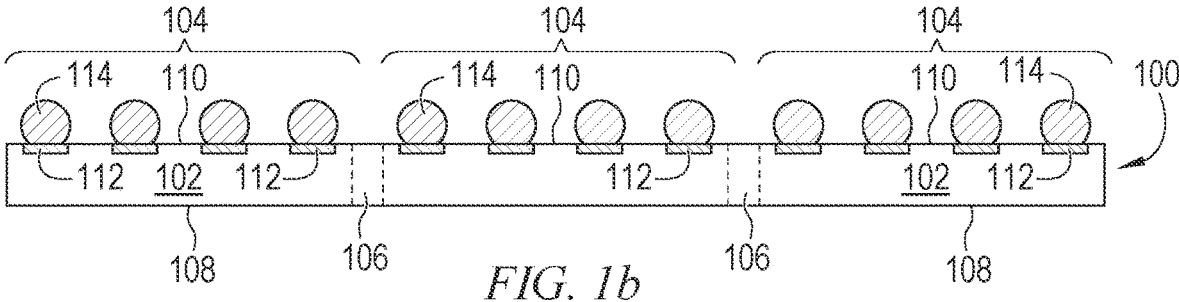

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit.

Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
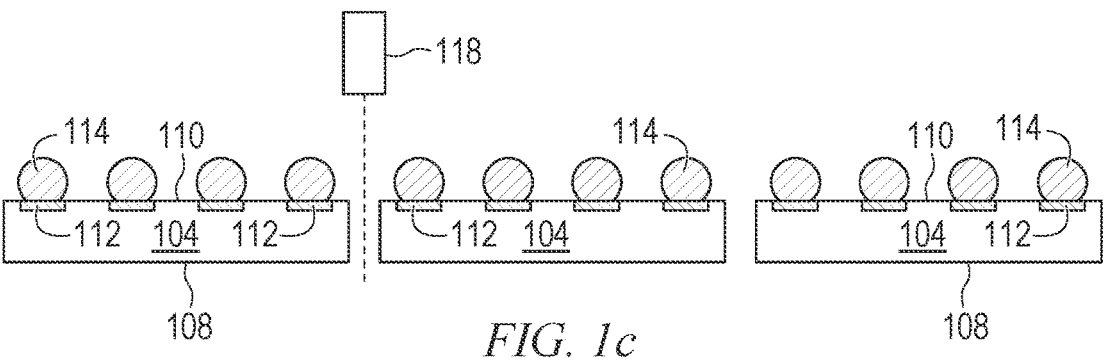

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or known good unit (KGD/KGU) post singulation.

Figures 2A, 2B, 2C:
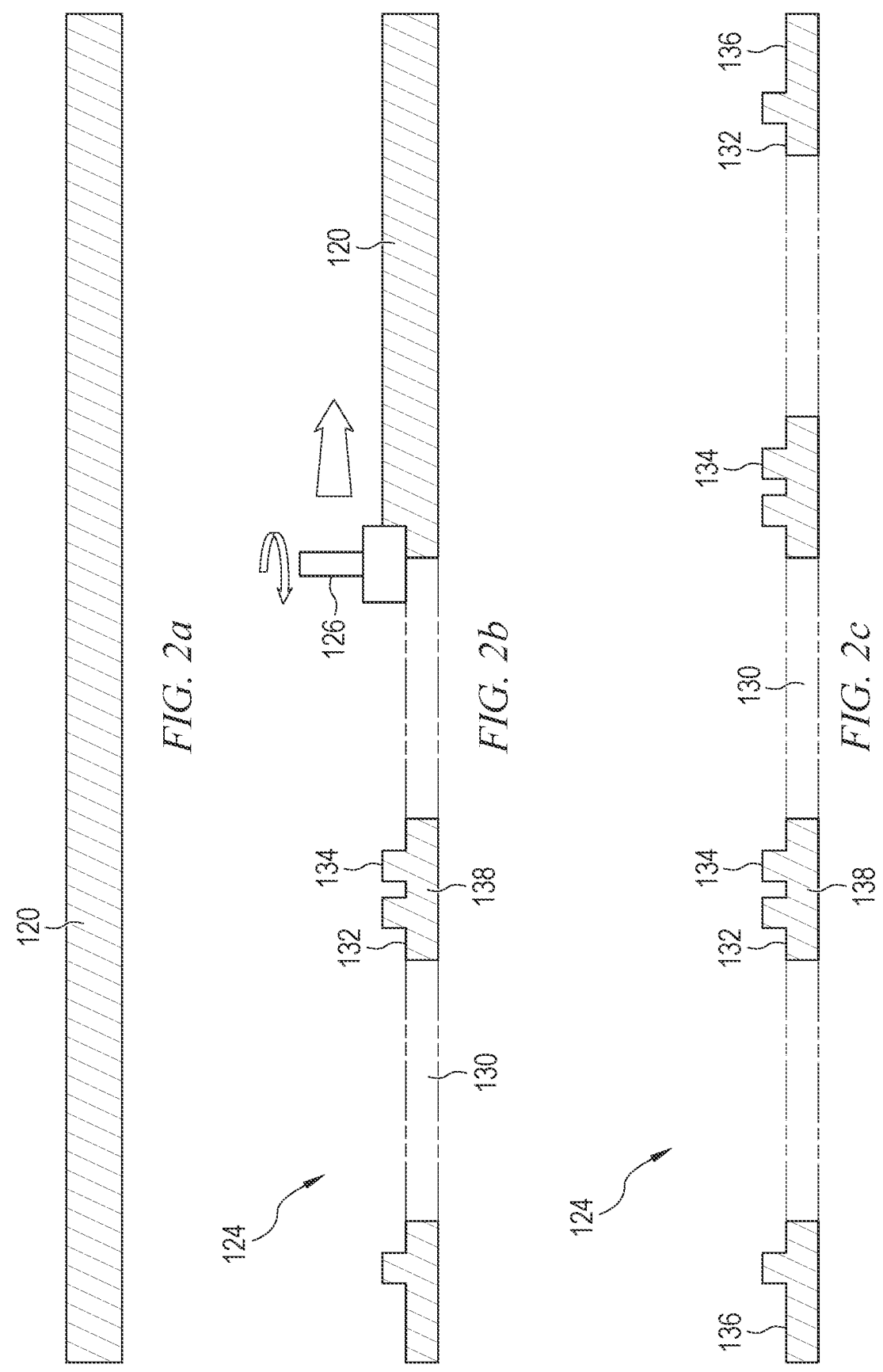
FIGS. 2a-2f illustrate forming a boat carrier with a Polytetrafluoroethylene (PTFE) coating to reduce electrostatic discharge.

FIGS. 2a-2f illustrate a process of forming a semiconductor manufacturing boat with a Polytetrafluoroethylene (PTFE) coating to reduce the impacts of electrostatic discharge during manufacturing of semiconductor devices. Manufacturing of a boat carrier typically begins with a flat sheet 120 of material as shown in FIG. 2a. The material for sheet 120 is most commonly aluminum or stainless steel (e.g., SUS 304), but other metals such as copper, gold, steel, nickel, combinations and alloys thereof, or other suitable metals are used in other embodiments. A stainless steel sheet 120 can be formed by extrusion or rolling to flatten a large block of stainless steel into a sheet. The source stainless steel block may be heated above or near its melting temperature, or at least to a high enough temperature to soften the material, to aid in the flattening process. Sheet 120 can also be a polymer or any other suitable non-metal material. Regardless of the material, sheet 120 may be formed by molding, 3d-printing, carving, cutting, extrusion, rolling, or another suitable means. A vertical thickness of sheet 120 can be selected to coincide with a desired maximum thickness of the boat being manufactured so that areas where the boat is thickest do not need to be further processed.

FIG. 2b shows machining, shaping, or forming sheet 120 into the desired shape for a boat 124. A boat in semiconductor manufacturing is a support structure for semiconductor die, semiconductor package substrates, other types of substrates, or other semiconductor devices used to support the devices during the manufacturing process. A boat can hold 10's, 100's, or more devices for large-scale processing. The processing can include transportation, formation and patterning of insulating and conductive layers, mounting of electrical components, solder reflow, bond wire formation, encapsulant molding, or any other semiconductor manufacturing process.

Boat 124 is formed by machining with a CNC head 126. CNC head 126 is controllable with a CNC machine to remove the material of sheet 120 in an accurately controlled manner to leave only the desired material for boat 124. CNC head 126 rotates rapidly and has blades or other structures to remove material from sheet 120. CNC head 126 can be moved down to cut completely through the vertical thickness of sheet 120, e.g., to form openings 130, or lifted to only cut partially through the sheet, e.g., to form flanges 132. Removing sheet 120 material to form boat 124 may also be a multi-step process where only the top, e.g., millimeter of material is removed before lowering CNC head 126 another millimeter at a time to eventually reach the full thickness of the sheet. Other areas of sheet 120 are not processed by CNC head 126, e.g., pins 134, in embodiments where sheet 120 was made to the desired thickness for the height of the pins. In other embodiments, sheet 120 is made thicker than the desired height for pins 134, and some material is removed over the pins to provide a specific desired finish to the tops of the pins. In one particular embodiment, illustrated in FIGS. 5a-5d and described in more detail below, frame 136, arms 138, and flanges 132 are formed from sheet metal and then pins 134 are press fit into openings of the sheet metal.

Figure 2D:
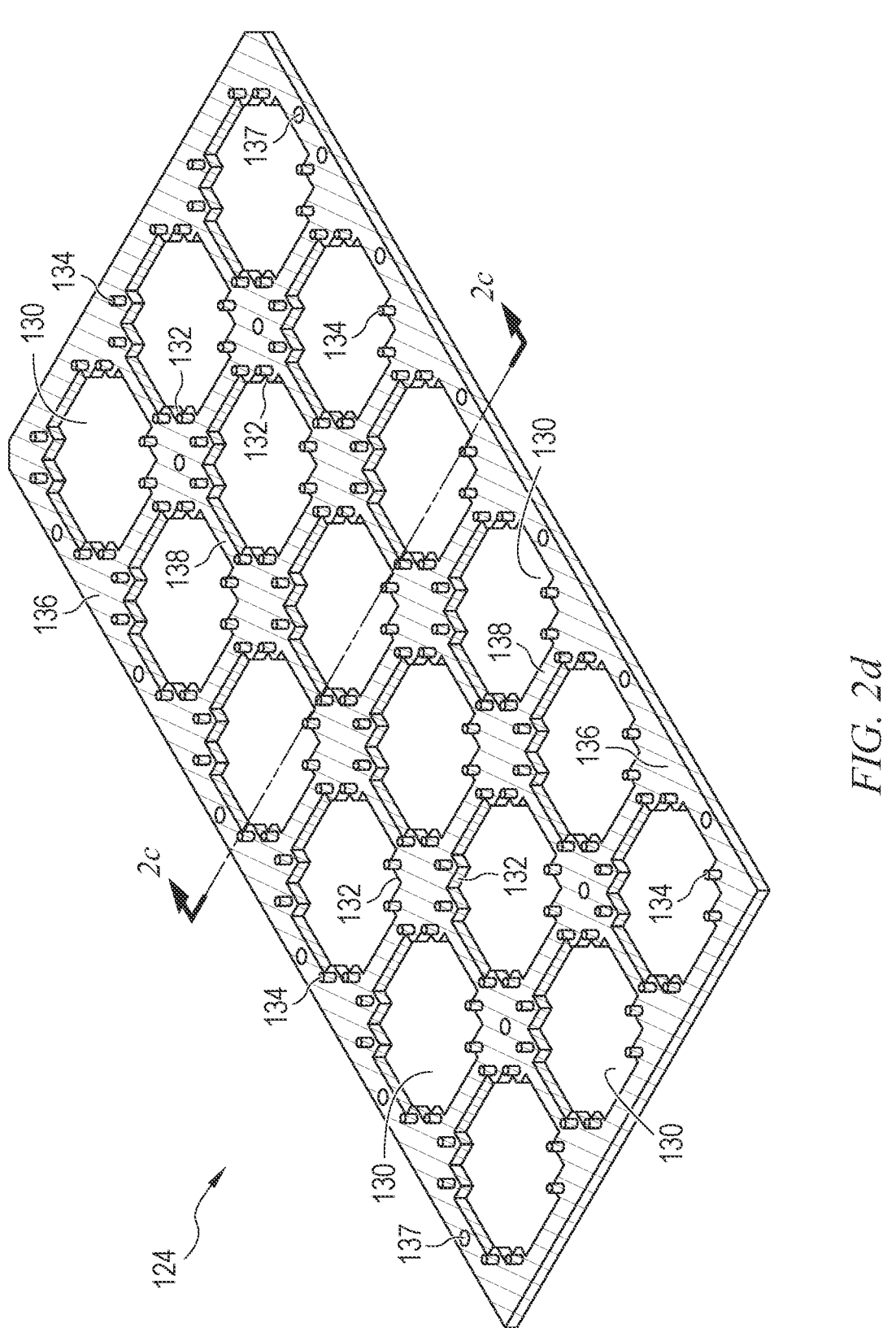

FIGS. 2c and 2d show boat 124 after the process of shaping sheet 120 into the boat has been completed. FIG. 2c is a cross-sectional view and FIG. 2d is a perspective view. Flanges 132 support the workpiece on the boat over openings 130. The term workpiece is used to refer to a substrate, leadframe, semiconductor die, or any other object supported by boat 124 for processing. A separate opening 130 is formed for each workpiece, with flanges 132 formed only in the corners of each opening 130 to increase the total amount of the bottom surface of the workpiece that is exposed from the bottom of the boat.

Opening 130 is illustrated as square because most semiconductor devices tend to be square, but openings 130 can be formed in any desired shape to accommodate a device being manufactured. In particular, tablet and mobile phone PCBs tend to have very irregular shapes and a boat 124 can be formed with openings 130 and flanges 132 in any arbitrary shape according to the workpiece shape. Flanges 132 can be formed in corners, along edges, or at any other location around the perimeter of openings 310. Flanges 132 can be formed at regular intervals, irregularly, or continuously around the entire opening 130. Flanges 132 include smaller pins, pegs, or posts that extend through openings in the workpiece in some embodiments, which help keep the workpiece aligned.

A workpiece to be processed is set on boat 124 over an opening 130 with the corners of the workpiece supported by flanges 132. Opening 130 allows processing of the bottom of the workpiece. Posts 134 hold the workpiece against lateral shifting on boat 124, which could throw off critical alignment of processing steps.

Boat 124 is formed with a frame 136 extending around the entire boat. Frame 136 is used to hold boat 124, both by workers who have to pick up the boat by hand and by processing equipment that may move the boat around using rollers, pinchers, or another suitable mechanism. Frame 136 optionally includes periodic openings 137 used by automation equipment to detect a precise position of boat 124 or to hold the boat more securely. Arms 138 extend between each opening 130 to keep the shape of boat 124 across the spans of multiple workpiece areas.

The shorter flat areas of boat 124, e.g., frame 134, arms 138, and flanges 132, comprise a plate of the boat. The plate is a uniform thickness across the entire boat 124. Posts 134 extend upward from the plate. The relative thicknesses of pins 134 and the flat plate can be modified as desired and is not necessarily illustrated to scale. In most embodiments, frame 136, arms 138, and flanges 132 are significantly thinner than the height of pins 134. In some embodiments, the flat plate is manufactured as an initial step, with openings 130 formed through the flat plate to leave frame 134, arms 138, and flanges 132, and then pins 134 are attached to the flat plate, e.g., by welding, bolts, adhesive or another suitable fastening mechanism.

Figures 2E, 2F:
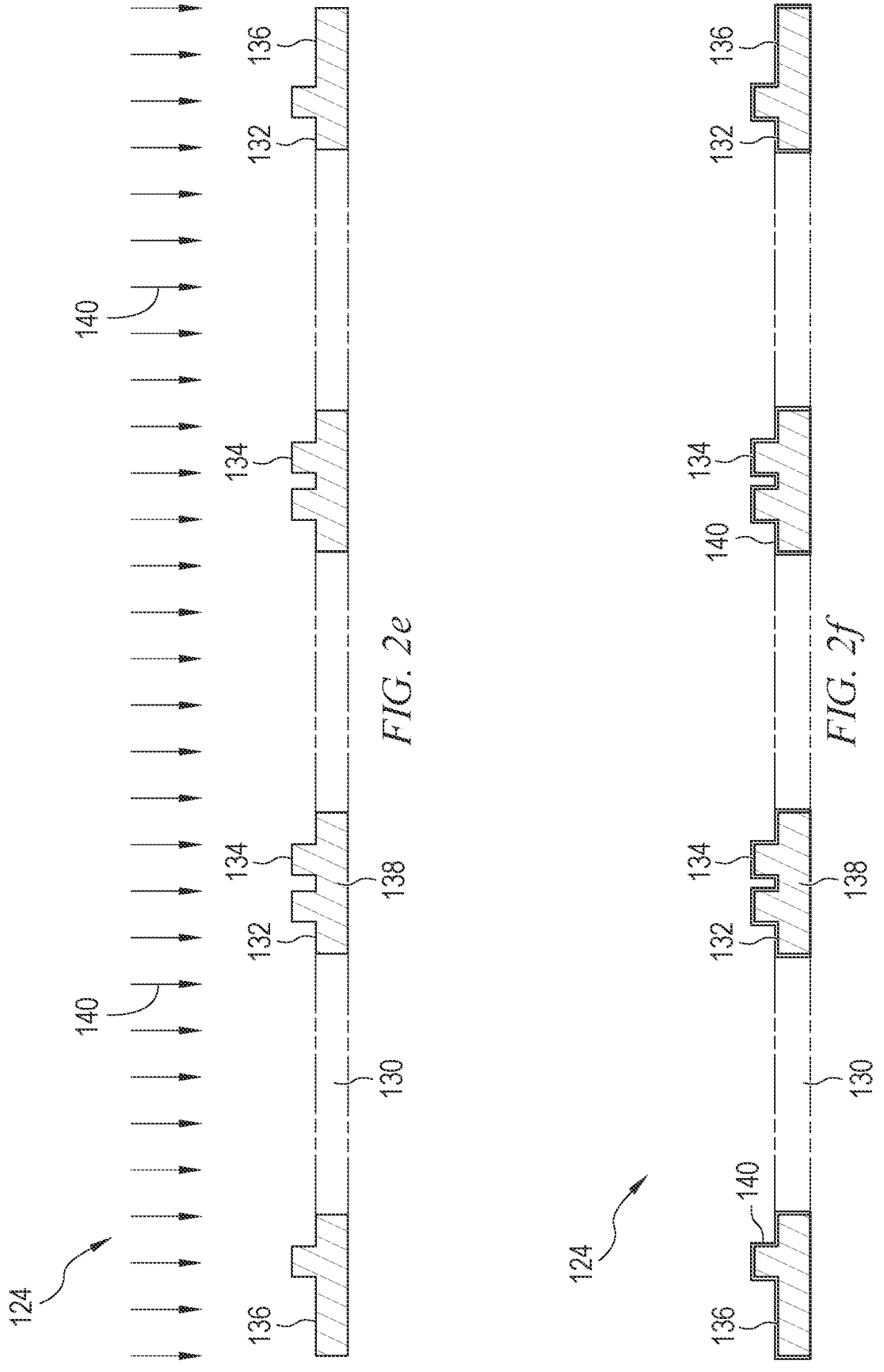

FIG. 2e illustrates a process of depositing a PTFE coating 140 over boat 124. PTFE coating 140 is comprised of PTFE in some embodiments, but not all embodiments. In other embodiments, PTFE coating 140 is an insulating layer containing one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. PTFE coating 140 can be formed using PVD, CVD, printing, lamination, spin coating, spray coating, sintering, thermal oxidation, or another suitable process deposition process.

FIG. 2e shows PTFE coating 140 being sputtered from above so that the deposited insulating layer covers all top and side surfaces of boat 124 once sputtering is complete, as shown in FIG. 2f. PTFE coating 140 has a substantially uniform thickness and composition over the entire covered surface area of boat 124. Coating boat 124 with PTFE or another suitable insulating material reduces the likelihood that ESD received by the boat during the manufacturing process will reach a workpiece supported by the boat. PTFE is electrically insulating so electricity can flow through the stainless steel substrate material of boat 124 without the workpieces being electrically connected and potentially damaged. PTFE has a high dielectric constant to effectively reduce ESD and also a high mechanical strength to withstand wear and tear during use.

In testing, boat 124 with PTFE coating 140 had a surface resistance between 1.1*10^9 and 4.5*10^9 across the entire surface area of boat 124 when eight test points across the boat were measured, sufficient for the intended ESD reducing purpose. With a static charge of less than 100 Volts applied, a measured voltage at the same test points distributed across boat 124 remained between 2 Volts and 11 Volts, a significant reduction and unlikely to damage a workpiece. PTFE coating 140 greatly improves boat 124 by providing ESD reducing properties.

Figures 3A, 3B:
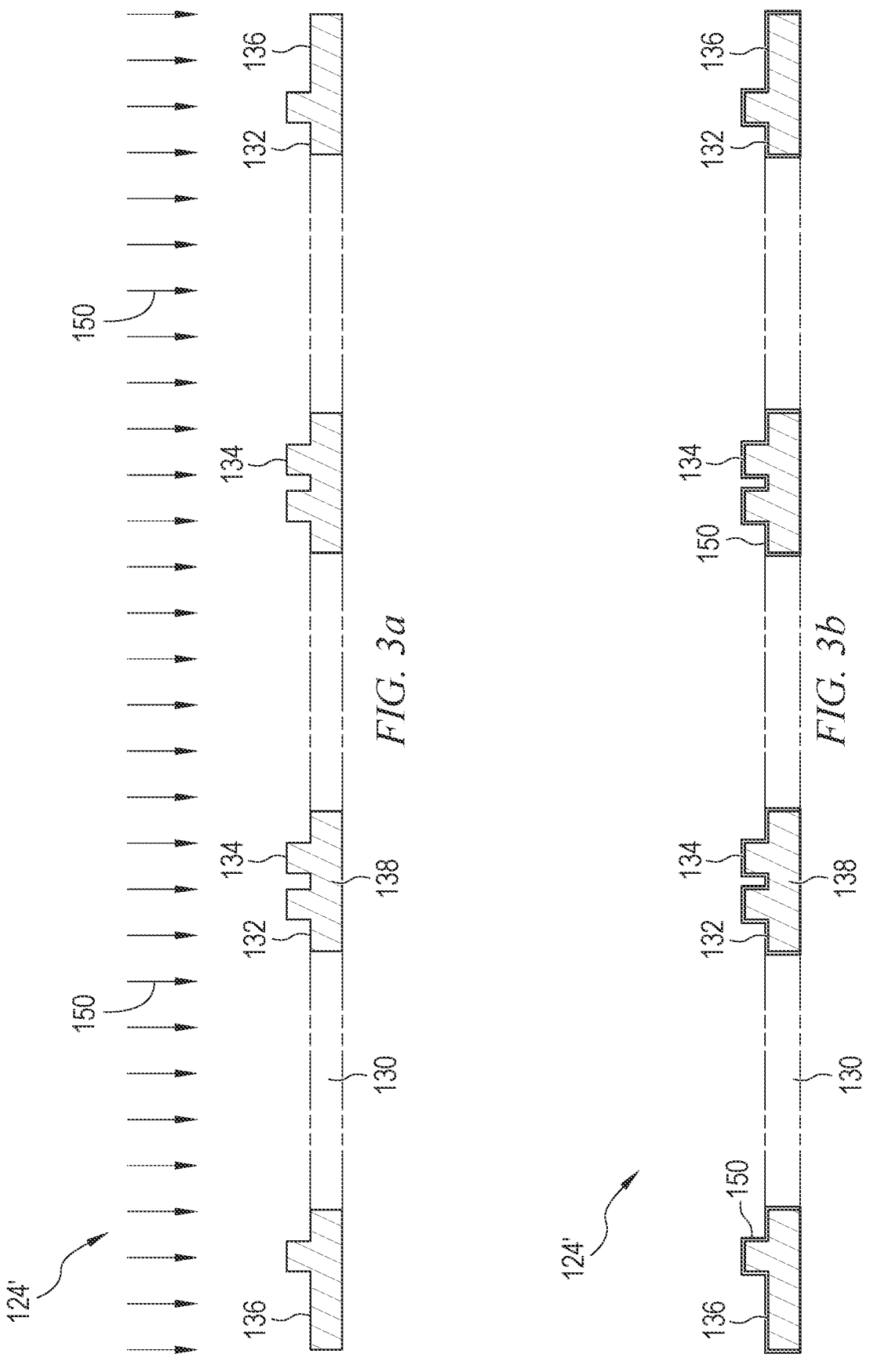
FIGS. 3a-3e illustrate using a primer layer to increase adhesion of the PTFE coating.

FIGS. 3a-3e illustrate another embodiment with a primer layer used to increase the adhesion of PTFE coating 140' to a boat 124'. One or two apostrophes after a reference number indicates that the item being referred to is essentially identical to the same reference number without apostrophes but used in a different example or applied in a slightly different way. Continuing from FIG. 2c, FIG. 3a shows deposition of primer layer 150 onto boat 124'. Primer layer 150 is an insulating layer comprised of a similar material to those disclosed above for PTFE coating 140, or another suitable primer material, and deposited in one of the above-described methods. Primer layer 150 is sputtered in FIG. 3a to form a substantially uniform coating over all exposed top and side surfaces of boat 124' in FIG. 3b. The material selected for primer layer 150 has a better adhesion to surfaces of boat 124' than PTFE coating 140.

Figures 3C, 3D:
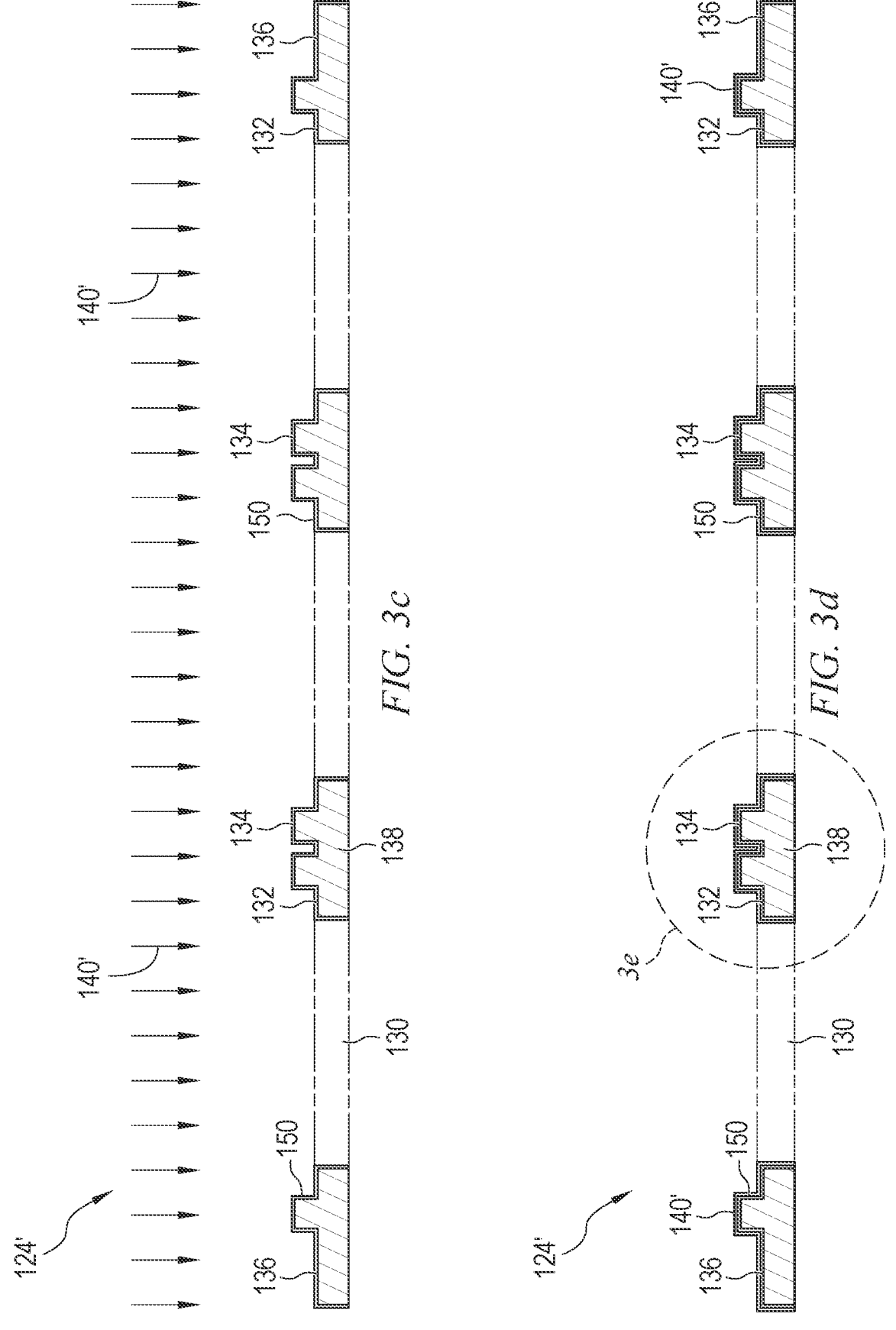
Figure 3E:
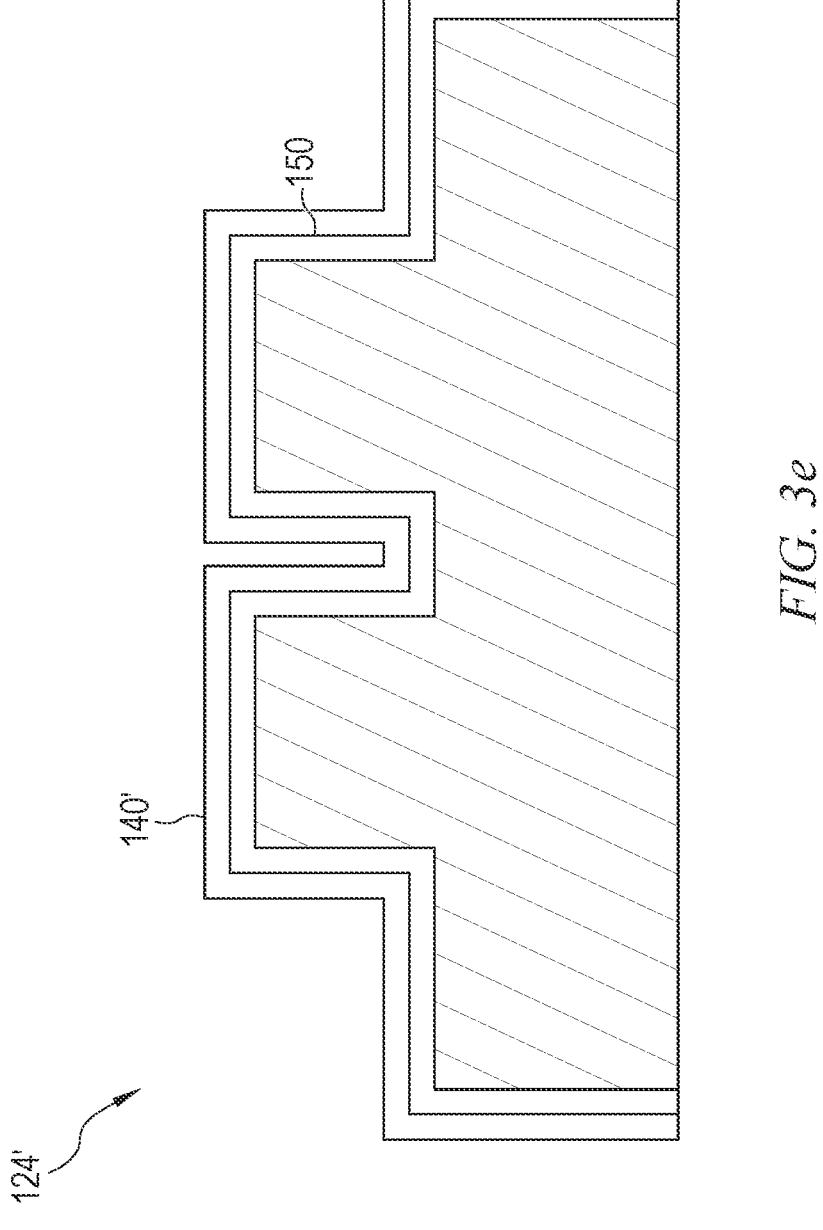

In FIG. 3c, when PTFE coating 140' is deposited as in FIG. 2e, a uniform coating of PTFE is formed over primer layer 150 as shown in FIGS. 3d and 3e. FIG. 3d shows boat 124' as a whole and FIG. 3e is a close-up view of one section of the boat illustrating the two layers 150 and 140' in better detail. PTFE coating 140' has a better adhesion to primer layer 150 than to the underlying surfaces of boat 124'. Therefore, applying primer layer 150 between PTFE coating 140' and boat 124' increases the mechanical resilience of the finished boat. PTFE coating 140' is less likely to chip or flake off when handling, resulting in a boat 124' that can be in service longer and thereby reducing costs.

Figure 4A:
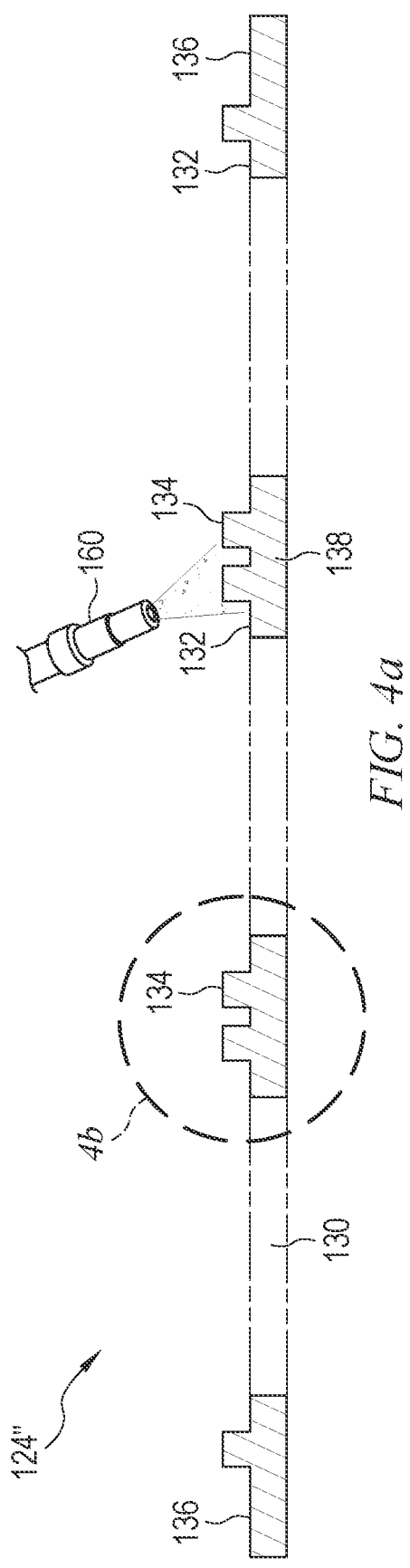
FIGS. 4a-4e illustrate sanding the boat carrier to increase adhesion of the PTFE coating.

FIGS. 4a-4e illustrate another option to increase adhesion of the PTFE coating. FIG. 4a illustrates a sandblasting nozzle 160 being used to roughen the surfaces of a boat 124". Sandblasting nozzle 160 sprays particles of sand, which impact the metal of boat 124" and thereby removes some of the material of boat to roughen up the surfaces thereof. Sandblasting nozzle 160 can be controlled by a CNC machine or other suitable means to traverse over and thoroughly roughen up all surfaces of boat 124" on which a PTFE coating will be applied.

Figure 4B:
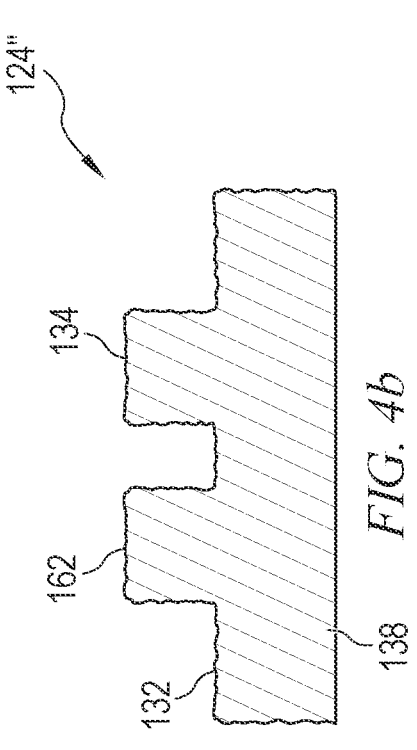

Sandblasting imparts a rough texture 162 onto surfaces of the boat. FIG. 4b is a zoomed-in view to better illustrate surface texture 162, although the surface texture can be any type or shape of surface roughness or asperity and won't necessarily look similar to the specific shape shown in the figures. Of course, all surfaces have asperities to some extent. Sanding with sandblasting nozzle 160 increases the amplitude, frequency, and other roughness parameters of the surface roughness of boat 124". Surface roughness can also be increased using alternative means, such as chemical treatments, powder coating, or other types of sanding.

Figures 4C, 4D:
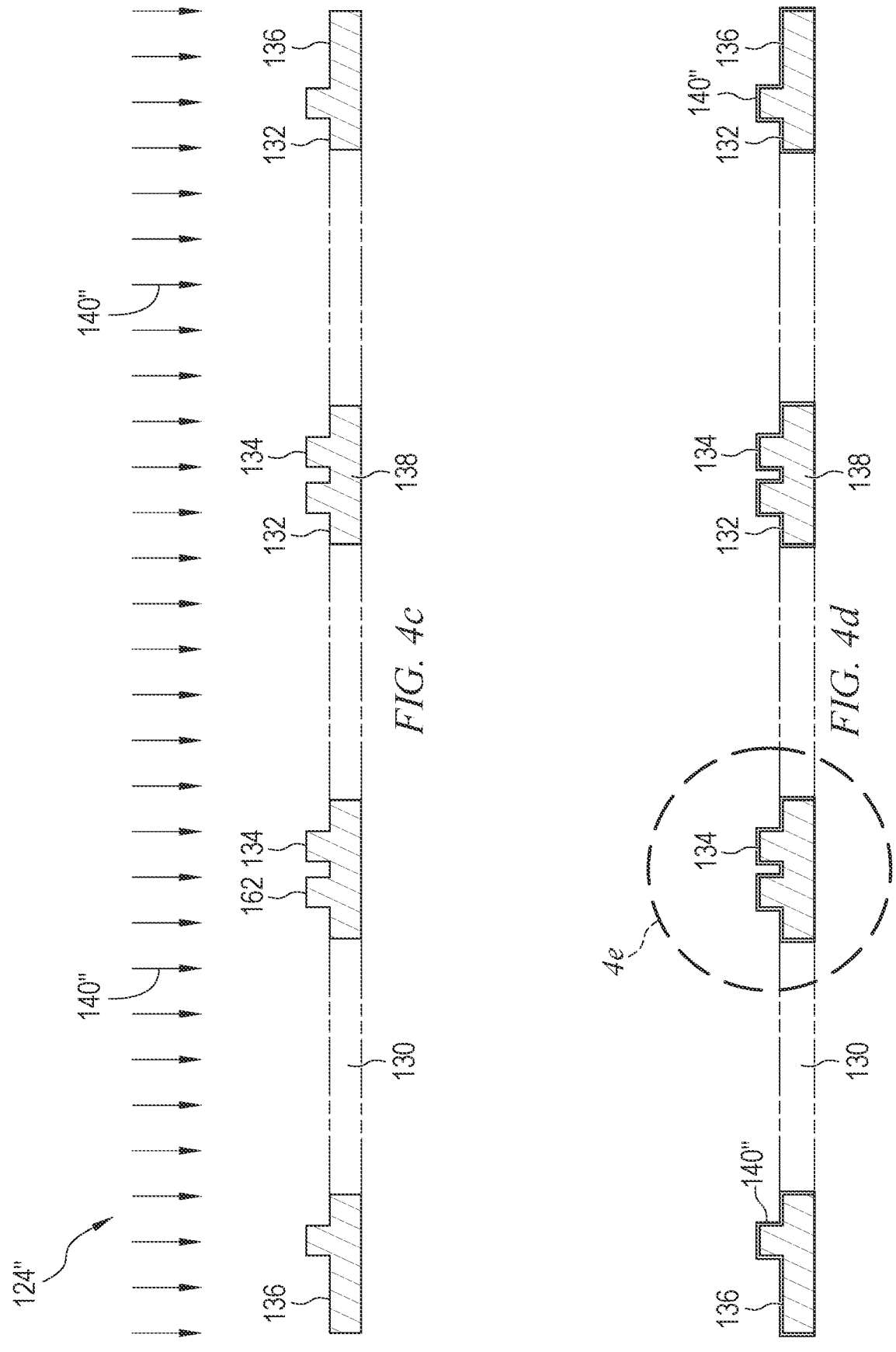
Figure 4E:
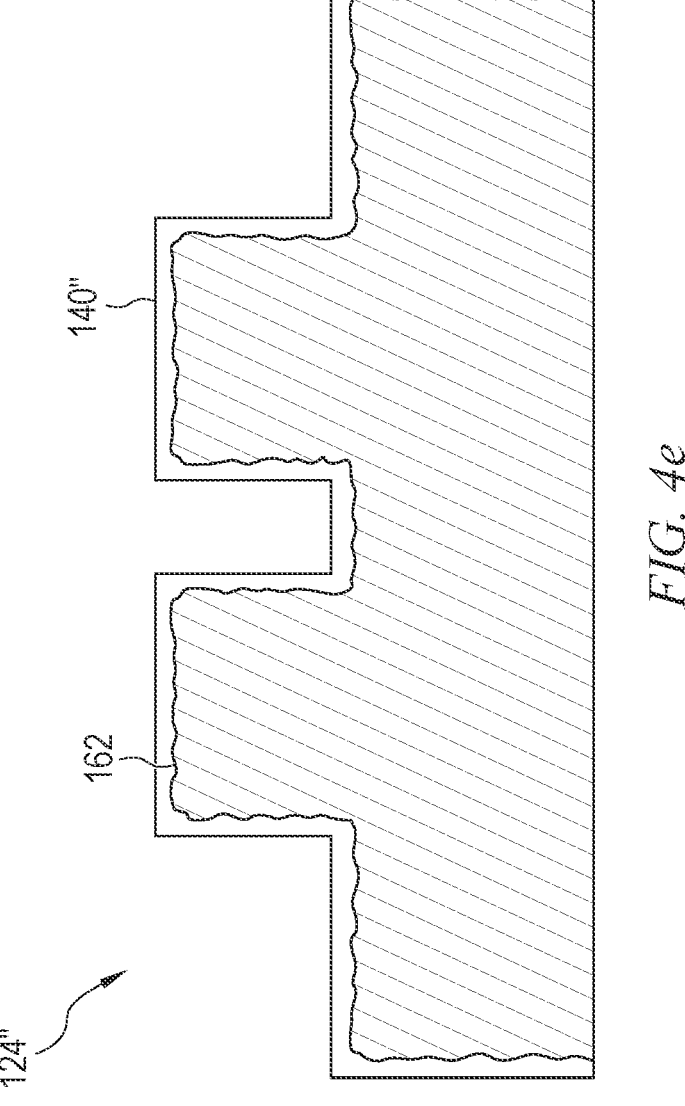

In FIG. 4c, PTFE coating 140" is sputtered or otherwise disposed over boat 124" as described above for PTFE coating 140. FIG. 4d and FIG. 4e show PTFE coating 140" after sputtering. PTFE coating 140" is applied as a liquid or as small particles that penetrate into and fill the crevices of surface texture 162. Once the crevices of surface texture 162 are full, continued application of PTFE coating 140" creates a substantially flat upper surface as with PTFE coatings 140 and 140'. The extension of PTFE coating 140" into surface texture 162 increases the adhesion of the PTFE coating to boat 124 by increasing surface area of physical contact. Sanding with sander head 160 increases the surface roughness and thereby adhesion. PTFE coating 140" is less likely to chip or flake off when handling, resulting in a boat 124" that can be in service longer and thereby reducing costs. In some embodiments, sanding with sandblasting head 160 is used in combination with primer layer 150 and PTFE layer 140'.

Figures 5A, 5B:
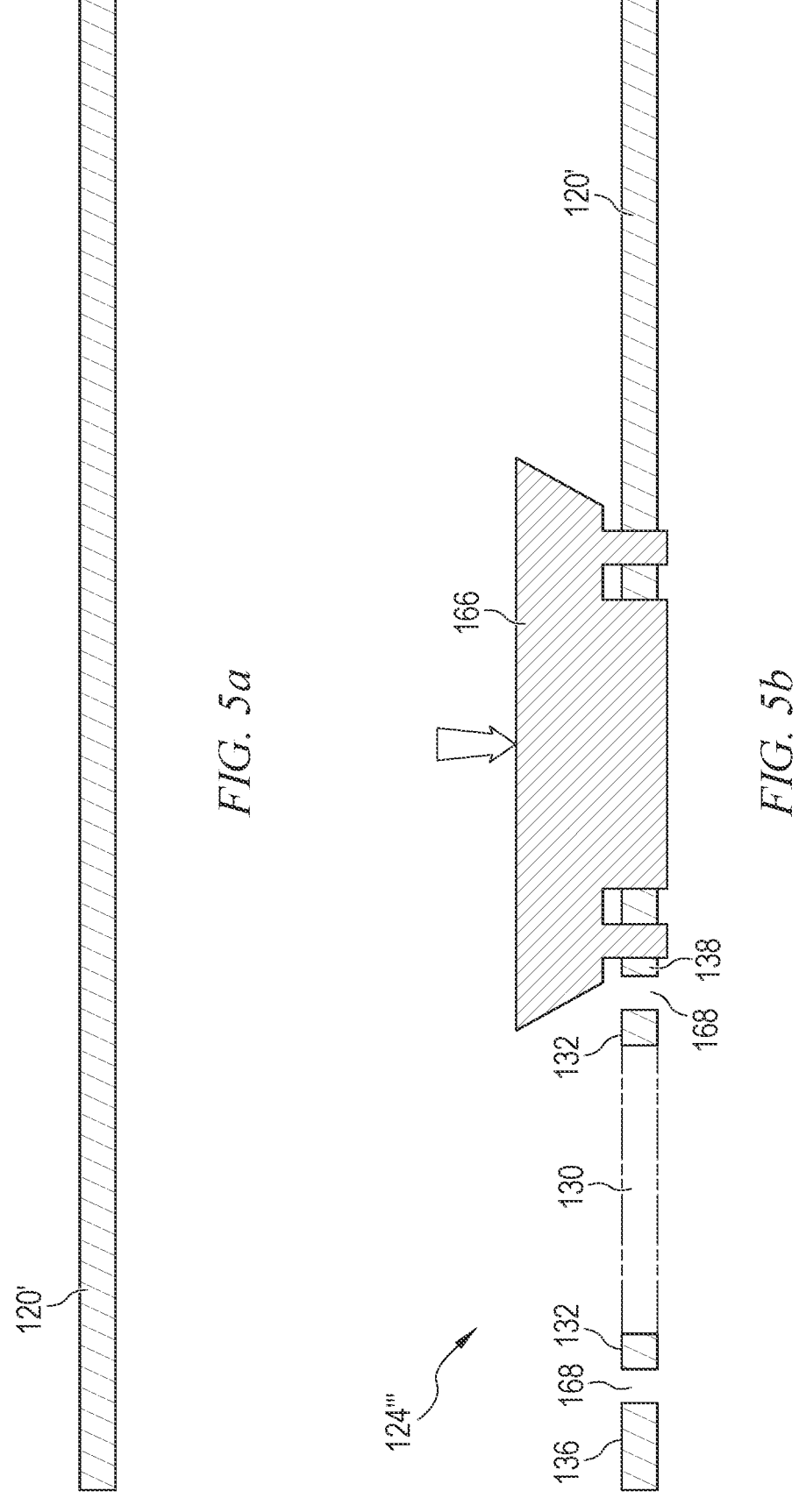
FIGS. 5a-5d illustrate an alternative manufacturing embodiment for the boat carrier.

FIGS. 5a-5e illustrate an alternative embodiment for forming a boat carrier. FIG. 5a illustrates a piece of sheet metal 120'. Sheet metal 120' is similar to sheet 120 used above but formed to the thickness of the flat portions of the boat carrier, e.g., frame 136, arms 138, and flanges 132.

In FIG. 5b, a punch 166 is used to punch holes through sheet metal 120' to form openings 130. In addition, punch 166 forms openings 168 through sheet metal 120' where pins 134 are going to be installed. Punch 166 has a shape configured to form all the openings for a single unit being formed, and then is used to punch once per unit. In other embodiments, a single larger punch is used to form openings for multiple units at once. A press machine is used to form openings through sheet metal 120' using punch 166.

Figures 5C, 5D:
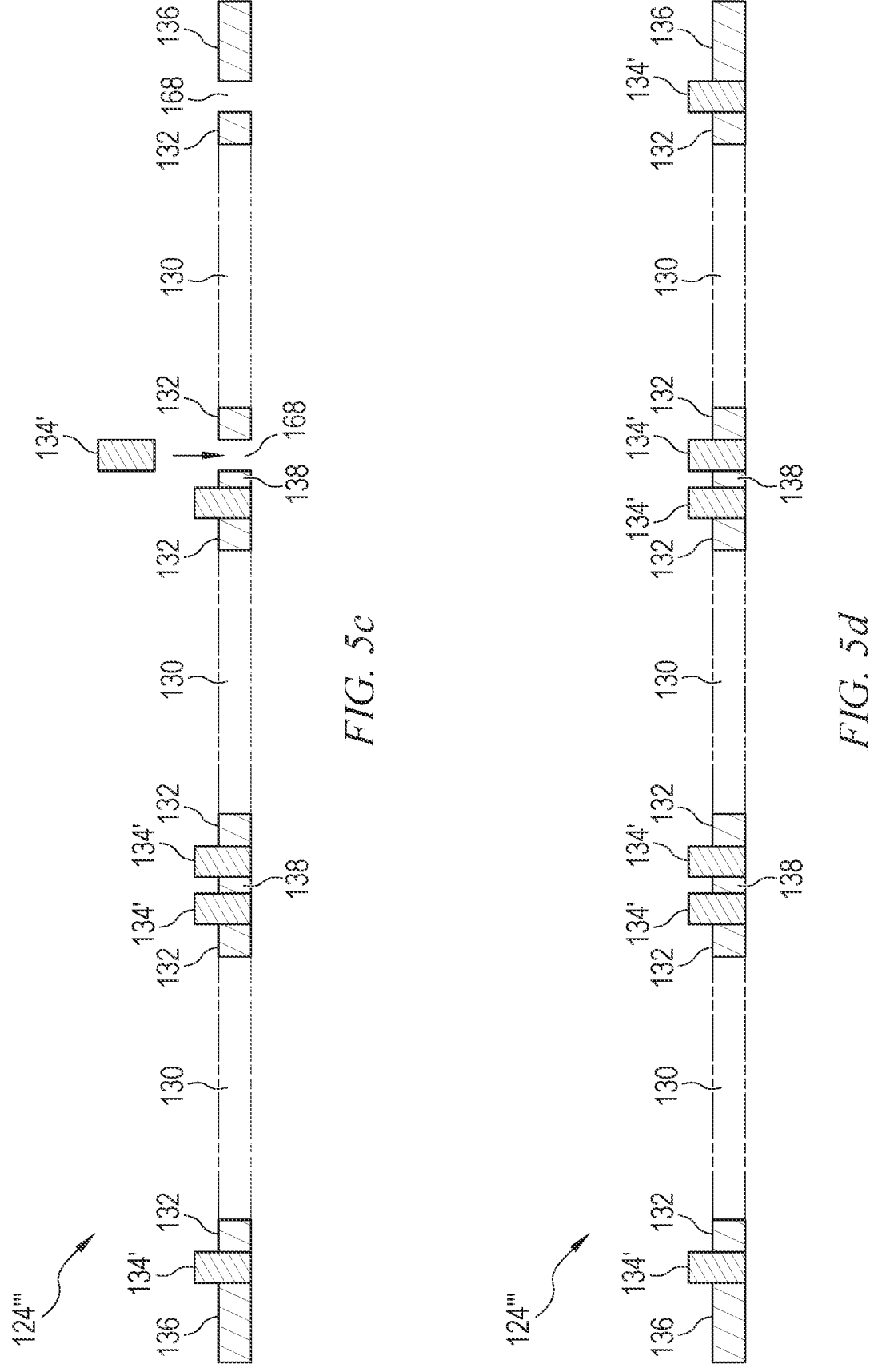

FIG. 5c shows pins 134' being inserted into openings 168. Pins 134' are press fit into openings 168 to securely attach the pins to sheet metal 120'. A specialized pin insertion machine is used in some embodiments. FIG. 5d illustrates a completed boat 124''' with pins 134' formed separately and then press fit into sheet metal 120'. Boat 124''' is formed through an easier and cheaper process than boat 124. Boat 124" is compatible with any of the above-described PTFE coating embodiments.

Figures 6A, 6B:
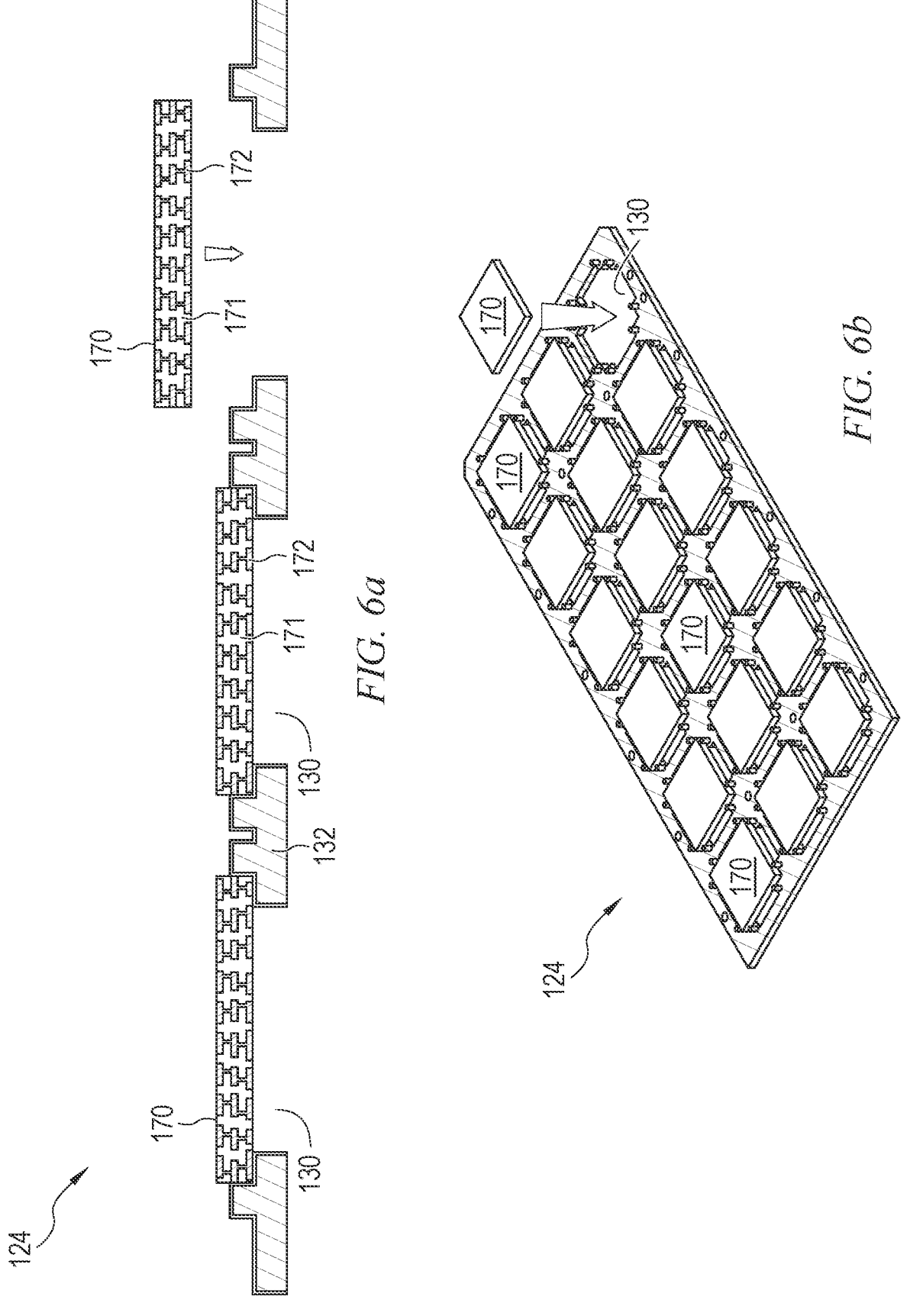
FIGS. 6a-6d illustrate creating semiconductor packages using the boat carrier.

FIGS. 6a-6d illustrate formation of semiconductor packages using boat 124 with PTFE coating 140. Any of the above described and illustrated PTFE coating or boat embodiments can be used similarly. In FIGS. 6a and 6b, a plurality of package substrates 170 is disposed on boat 124 after forming PTFE coating 140. Each substrate 170 is disposed over a separate opening 130 and is supported by flanges 132. Substrate 170 includes a plurality of insulating layers 171 and conductive layers 172 interleaved over each other to form the desired signal routing for the packages being manufactured.

Conductive layers 172 can be one or more layers of Al, Cu, Sn, Ni, Au, Ag, or other suitable electrically conductive material. Conductive layers 172 can be formed using PVD, CVD, electrolytic plating, electroless plating, or another suitable metal deposition process. Conductive layers 172 provide horizontal electrical interconnect across substrate 170 and vertical electrical interconnect between surfaces and layers of the substrate. Portions of conductive layers 172 can be electrically common or electrically isolated depending on the design and function of the package being formed.

Insulating layers 171 contain one or more layers of SiO2, Si3N4, SiON, Ta2O5, Al2O3, solder resist, polyimide, BCB, PBO, and other material having similar insulating and structural properties. Insulating layers 171 can be formed using PVD, CVD, printing, lamination, spin coating, spray coating, sintering, thermal oxidation, or another suitable process. Insulating layers 171 provide isolation between conductive layers 172. Any number of conductive layers 172 and insulating layers 171 can be interleaved over each other to form substrate 170. Any other suitable type of package substrate or leadframe is used for substrate 170 in other embodiments.

Figures 6C, 6D:
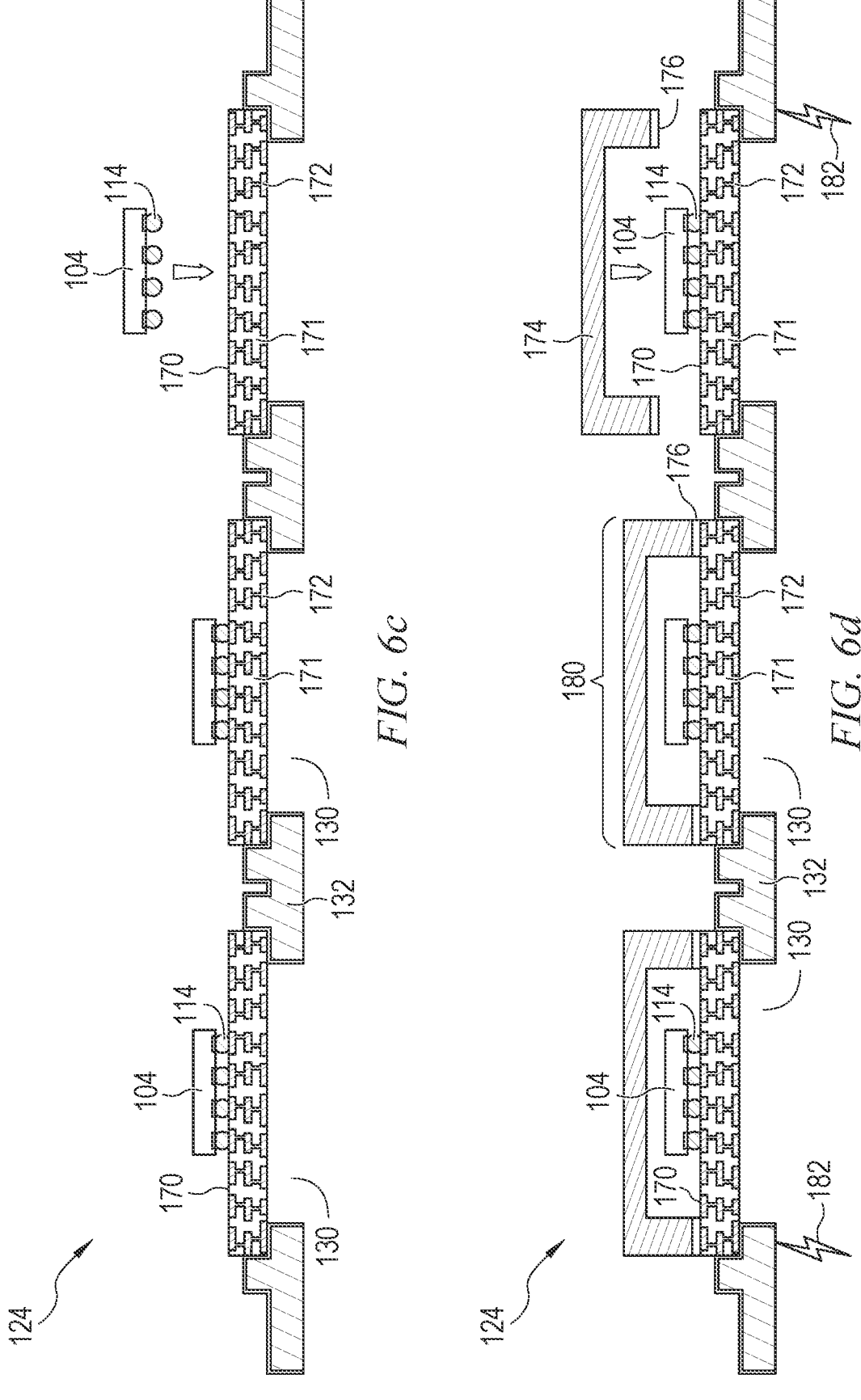

Semiconductor die 104 are disposed over substrates 170 in FIG. 6c using a pick and place or other appropriate process. Semiconductor die 104 are electrically and mechanically connected to substrate 104 by reflowing bumps 114. Any other desired electrical components, such as discrete active or passive components, more semiconductor die, semiconductor packages, or electrical connectors, can be mounted onto either the top or bottom surface of substrate 170 to create an electrical circuit with the desired functionality.

In FIG. 6d, lids 174 are mounted onto substrates 170 over semiconductor die 104 to finish packages 180. Lids 174 are optional and not used in all embodiments. An adhesive 176 is used to attach lid 174 to substrate 170. In some embodiments, adhesive 176 is electrically conductive to electrically connect lid 174 to substrate 170, e.g., to ground the lid to improve blocking of electromagnetic interference (EMI). Semiconductor die 104 may also be protected by depositing an encapsulant over the die or left bare without protection in other embodiments. In one embodiment, semiconductor die 104 is already packaged prior to disposing the semiconductor die over substrate 170.

During the process of mounting lids 174, an electrostatic discharge (ESD) 182 is imparted onto boat 124. Electrical current caused by ESD 182 flows through the conductive metal of boat 124 and eventually dissipates back out. While the electrical current is flowing, a significant voltage can be induced across boat 124. However, PTFE coating 140 is electrically insulating and does not allow significant electrical current from boat 124 to flow into substrates 170, which would be likely to damage semiconductor die 104. PTFE coating 140 operates as an insulating layer between boat 124 and packages 180 to block ESD from reaching the packages.

ESD 182 can occur at any stage of manufacturing and be caused by any number of factors. ESD 182 can occur while automation equipment is moving boat 124 between processing steps, or even while the boat is simply being stored waiting for the next manufacturing step to occur, which even waiting for a manufacturing step itself can be considered a manufacturing step. ESD is very difficult to prevent, but PTFE layer 140 reduces the impact that ESD has on manufacturing yield when ESD 182 inevitably hits boat 124. Boat 124 can be used to hold semiconductor die 104 for processing, substrates 170 for packaging of the semiconductor die, or larger printed circuit boards (PCBs) for manufacturing circuit boards for a wide variety of electronic devices. Openings 130, flanges 132, and pins 134 are reconfigured depending on the size and shape of the workpiece.

Figure 7A:
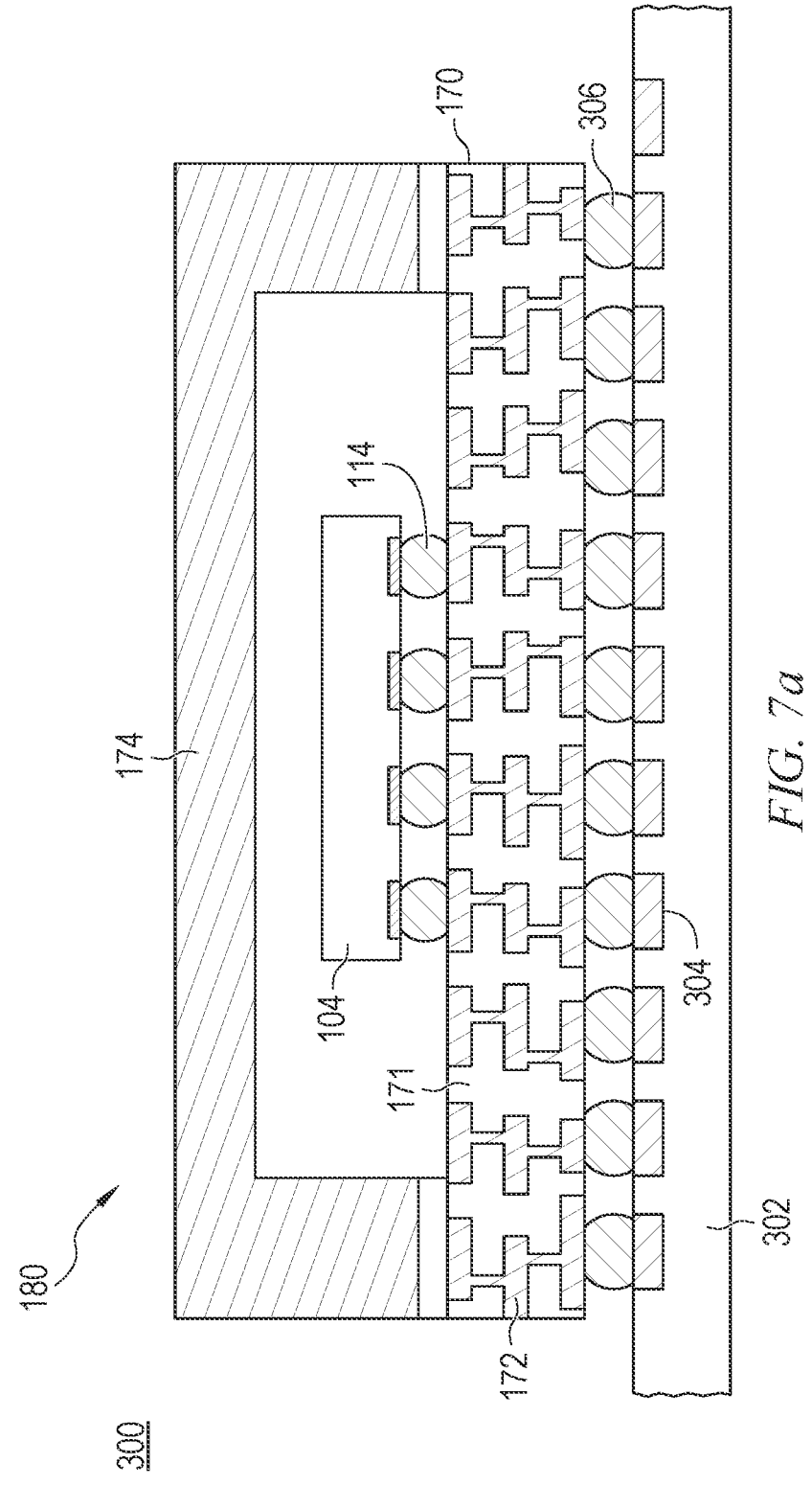
FIGS. 7a and 7b illustrate an electronic device with the semiconductor packages.
Figure 7B:
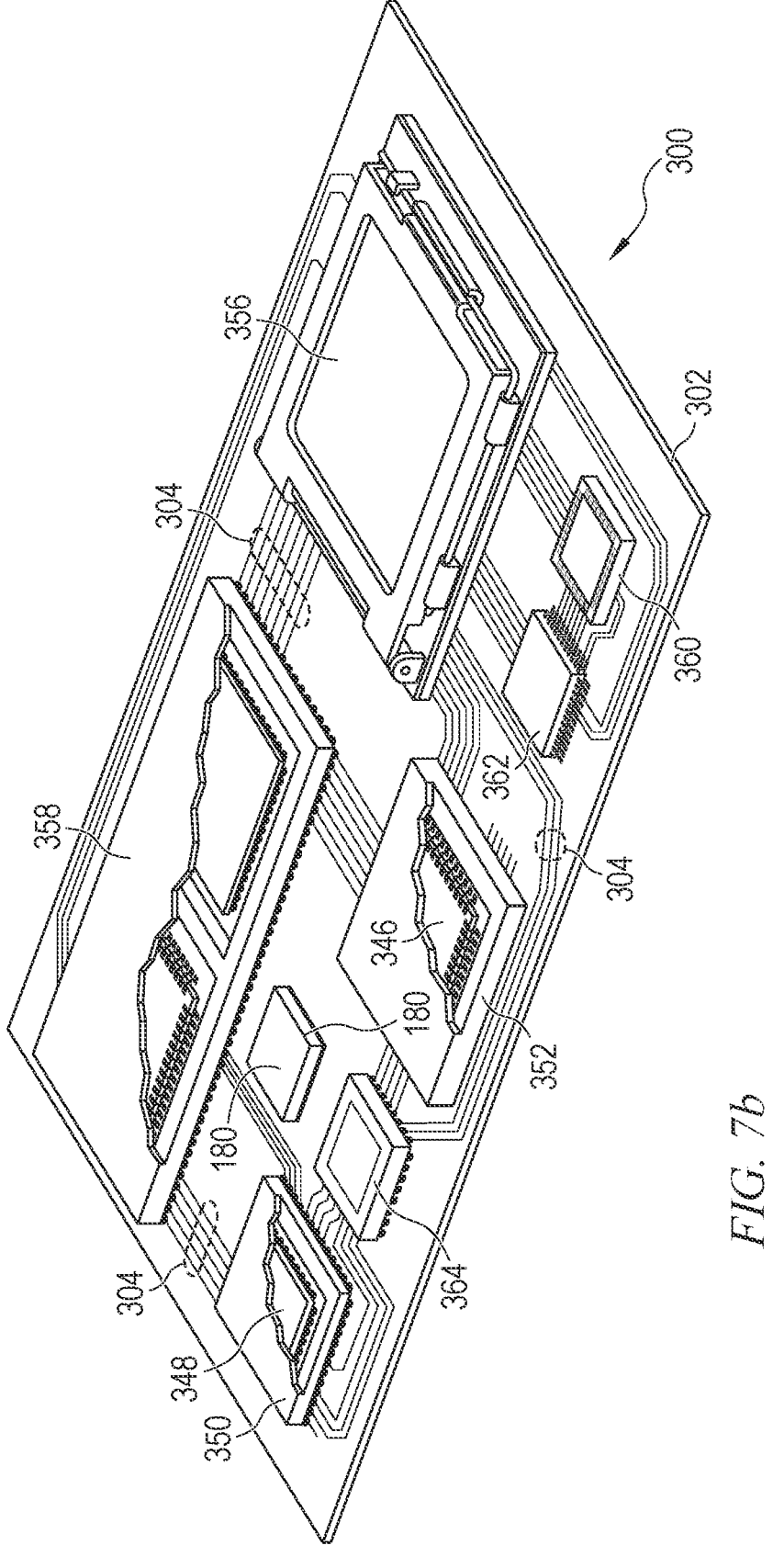

FIGS. 7a and 7b illustrate integrating semiconductor package 180 into a larger electronic device 300. FIG. 7a illustrates a partial cross-section of semiconductor package 180 mounted onto a printed circuit board (PCB) or other substrate 302 as part of electronic device 300. Bumps 306 are formed as described above for bumps 114 and reflowed onto conductive layer 304 of PCB 302 to physically attach and electrically connect semiconductor package 180 to the PCB. In other embodiments, thermocompression or other suitable attachment and connection methods are used. In some embodiments, an adhesive or underfill layer is used between semiconductor package 180 and PCB 302. Semiconductor die 104 is electrically coupled to conductive layer 304 through bumps 190, substrate 170, and bumps 114.

FIG. 7b illustrates electronic device 300 including PCB 302 with a plurality of semiconductor packages mounted on a surface of the PCB, including semiconductor package 180. Electronic device 300 can have one type of semiconductor package, or multiple types of semiconductor packages, depending on the application. Electronic device 300 can be a stand-alone system that uses the semiconductor packages to perform one or more electrical functions. Alternatively, electronic device 300 can be a subcomponent of a larger system. For example, electronic device 300 can be part of a tablet computer, cellular phone, digital camera, communication system, or other electronic device. Electronic device 300 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 7b, PCB 302 provides a general substrate for structural support and electrical interconnection of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between the semiconductor packages, mounted components, and other external systems or components. Traces 304 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 302. In other embodiments, a semiconductor device may only have the first level packaging where the die is mechanically and electrically mounted directly to PCB 302.

For the purpose of illustration, several types of first level packaging, including bond wire package 346 and flipchip 348, are shown on PCB 302. Additionally, several types of second level packaging, including ball grid array (BGA) 350, bump chip carrier (BCC) 352, land grid array (LGA) 356, multi-chip module (MCM) 358, quad flat non-leaded package (QFN) 360, quad flat package 362, and embedded wafer level ball grid array (eWLB) 364 are shown mounted on PCB 302 along with semiconductor package 180. Conductive traces 304 electrically couple the various packages and components disposed on PCB 302 to semiconductor package 180, giving use of semiconductor die 104 to other components on the PCB.

Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. In any case, PCB 302 can be supported on a boat 124 while the desired packages and other electronic components are mounted. PTFE layer 140 protects PCB 302 and other components mounted on the PCB from ESD during the manufacturing process.

By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   forming a boat carrier by,
      providing a flat sheet of stainless steel, wherein a thickness of the flat sheet is selected to coincide with a desired maximum thickness of the boat carrier, and
      machining, shaping, or forming the flat sheet to include an opening through the flat sheet and a pin extending from a flange;
   forming a Polytetrafluoroethylene (PTFE) layer over the boat carrier, wherein the PTFE layer coats the surfaces of the boat carrier including the opening, the pin, and the flange, and wherein the PTFE layer is an insulating layer comprising a PTFE material without additives in the PTFE material;
   disposing a semiconductor package substrate over the boat carrier; and
   performing a manufacturing step on the semiconductor package substrate, wherein an electrostatic discharge (ESD) is imparted on the boat carrier during the manufacturing step, and wherein the semiconductor package substrate is protected from the ESD by the PTFE layer.

2. The method of claim 1, further including sanding the boat carrier prior to forming the PTFE layer.

3. The method of claim 1, further including forming a primer layer over the boat carrier prior to forming the PTFE layer.

4. The method of claim 1, wherein the manufacturing step includes moving the boat carrier through a manufacturing facility.

5. The method of claim 1, further including disposing a semiconductor die over the semiconductor package substrate.

6. The method of claim 1, further including sputtering the PTFE layer onto the boat carrier.

7. A method of making a semiconductor device, comprising:
   forming a boat carrier by,
      providing a stainless steel sheet,
      forming a first opening through the stainless steel sheet,
      forming a plurality of second openings through the stainless steel sheet around the first opening, and
      disposing a plurality of pins with each of the plurality of pins disposed in a respective one of the second openings and extending above top surface of the stainless steel sheet; and
   forming a Polytetrafluoroethylene (PTFE) coating over the boat carrier, wherein the PTFE coating is insulating.

8. The method of claim 7, further including:
   disposing a semiconductor package substrate on the boat carrier over the opening and between the plurality of pins, wherein the semiconductor package substrate directly physically contacts the PTFE coating; and
   performing a manufacturing step on the semiconductor package substrate.

9. The method of claim 7, further including:
   disposing a semiconductor die over the boat carrier; and
   performing a manufacturing step on the semiconductor die.

10. The method of claim 7, further including:
   disposing an electronic device printed circuit board (PCB) over the boat carrier; and
   performing a manufacturing step on the electronic device PCB.

11. The method of claim 7, further including sanding the boat carrier prior to forming the PTFE layer.

12. The method of claim 7, further including forming a primer layer over the boat carrier prior to forming the PTFE layer.

13. The method of claim 7, wherein an electrostatic discharge (ESD) is imparted on the boat carrier.

14. A method of making a semiconductor device, comprising:
   providing a boat carrier including a conductive material; and
   forming an insulating coating on the boat carrier.

15. The method of claim 14, further including:
   disposing a semiconductor package substrate over the boat carrier; and
   performing a manufacturing step on the semiconductor package substrate.

16. The method of claim 14, further including:
   disposing a semiconductor die over the boat carrier; and
   performing a manufacturing step on the semiconductor die.

17. The method of claim 14, further including:
   disposing an electronic device printed circuit board (PCB) over the boat carrier; and
   performing a manufacturing step on the electronic device PCB.

18. The method of claim 14, further including sanding the boat carrier prior to forming the insulating layer.

19. The method of claim 14, further including forming a primer layer over the boat carrier prior to forming the insulating layer.

20. The method of claim 14, wherein an electrostatic discharge (ESD) is imparted on the boat carrier.

21. A semiconductor manufacturing device, comprising:

a boat carrier including stainless steel; and a Polytetrafluoroethylene (PTFE) coating formed on the boat carrier, wherein the PTFE coating is electrically insulating.

22. The semiconductor manufacturing device of claim 21, further including a semiconductor package substrate disposed over the boat carrier.

23. The semiconductor manufacturing device of claim 21, further including a semiconductor die disposed over the boat carrier.

24. The semiconductor manufacturing device of claim 21, further including an electronic device printed circuit board (PCB) disposed over the boat carrier.

25. The semiconductor manufacturing device of claim 21, further including a primer layer formed between the boat carrier and PTFE layer.

\* \* \* \* \*